United States Patent [19]

Abbiss et al.

[11] Patent Number: 5,046,840

[45] Date of Patent: Sep. 10, 1991

[54] IMPROVEMENTS IN A SYSTEM FOR DETERMINING ATMOSPHERIC DATA RELATING TO THE MOVEMENTS OF AN AIRBORNE VEHICLE

[75] Inventors: John B. Abbiss, Irvine; Anthony E. Smart, Costa Mesa; Roger P. Woodward, San Francisco, all of Calif.

[73] Assignee: The Titan Corporation, San Diego, Calif.

[21] Appl. No.: 286,334

[22] Filed: Dec. 19, 1988

[51] Int. Cl.⁵ ............................ G01P 3/36; H01S 3/04
[52] U.S. Cl. ........................................ 356/28; 372/35; 372/36; 357/81; 357/82; 359/503
[58] Field of Search ..................... 356/28, 28.5, 72; 372/34, 36, 35; 350/574; 62/238.2; 357/81, 82

[56] References Cited

U.S. PATENT DOCUMENTS

| | | | |
|---|---|---|---|
| 3,815,047 | 6/1974 | Smith et al. | 372/34 X |
| 4,315,225 | 2/1982 | Allen, Jr. et al. | 372/35 |
| 4,511,249 | 4/1985 | Frungel et al. | 356/5 |
| 4,631,728 | 12/1986 | Simons | 372/38 |
| 4,696,010 | 9/1987 | Eastman | 372/34 |
| 4,727,554 | 2/1988 | Watanabe | 372/34 X |
| 4,737,798 | 4/1988 | Lonis et al. | 372/34 X |
| 4,859,055 | 8/1989 | Gal et al. | 356/28 |

*Primary Examiner*—Linda J. Wallace
*Attorney, Agent, or Firm*—Ellsworth R. Roston; Charles H. Schwartz

[57] ABSTRACT

A plurality of lasers, each regulated to operate at a particular temperature, are supported by a manifold to direct coherent light into space. The regulation may be provided by producing pulses of a trickle current of a particular magnitude through the laser, measuring the voltage required to produce the trickle current and adjusting the characteristics of a thermoelectric member in accordance with the magnitude of such voltage to adjust the rate at which the thermoelectric member transfers heat from the laser. The lasers produce substantially parallel and thin beams of light in pairs. The light beams in each pair provide an optimum angle for the interception by such paired beams of particles having individual trajectories in space. These particles scatter the light to a receiving lens system disposed within the manifold. The received light then passes through masks which restrict the collected light to a spatial pattern corresponding to the pattern of the light beams from the lasers. The received light beams passing through the masks are detected to produce signals indicative of the light in such beams. The manifold temperature may be regulated to maintain the optical characteristics of the lasers and the receiving system at a constant and optimum value. The regulation may be provided by disposing heat sleeves on the manifold periphery, preferably in both axial and annular directions, and disposing in each heat sleeve a porous wick and a material convertible between liquid and gaseous forms. At positions above the regulated temperature, the liquid vaporizes and travels through the wick toward cooler spots where it vaporizes.

32 Claims, 4 Drawing Sheets

IMPROVEMENTS IN A SYSTEM FOR DETERMINING ATMOSPHERIC DATA RELATING TO THE MOVEMENTS OF AN AIRBORNE VEHICLE

This invention relates to improvements in a system for determining atmospheric data relating to the movements of an airborne vehicle. More particularly, the invention relates to improvements in a system included in the airborne vehicle for using energy scattered from aerosol particles in the atmosphere to determine a function of the movement and attitude of the airborne vehicle in the atmosphere. The invention further relates to a system for use with a laser to regulate the operating temperature of the laser.

Mechanical instruments have long been used to measure the relative speed between a moving object such as an airborne vehicle and the free airstream through which the airborne vehicle is moving. These mechanical instruments determine the kinetic pressure exerted by the moving airstream on a first defined area disposed on the airborne vehicle and facing the airstream. The mechanical instruments also determine the static pressure exerted on a second defined area disposed on the airborne vehicle in a substantially perpendicular relationship to the first defined area. The systems then compare the kinetic and static pressures to determine the relative air speed of the vehicle.

The mechanical instruments now in use typically employ Pitot tubes, pneumatic tubing and pressure transducers which are exposed to the external environment and are accordingly subject to degraded performance resulting from calibration changes from various causes such as aging or changes in temperature. They are also subject to catastrophic failures as a result of accidental breakage. Furthermore, they protrude physically into the airflow and provide a drag on the movement of the airborne vehicle.

As air navigation becomes increasingly complex, it becomes important to determine other data than the movement of the airborne vehicle relative to the ground. For example, it becomes increasingly important to know the characteristics of the air flow around the vehicle at each instant so that the response of the vehicle to such air flow can be properly controlled. The equipment now in use and discussed in the previous paragraphs has not been found satisfactory to provide the sensitive and accurate data which is now often required.

A considerable effort has been made for a long period of time, and substantial sums of money have been expended during such period, to develop a system which will overcome the disadvantages discussed above. For example, systems have been developed using aerosol particles in the atmosphere to obtain desired air data. Such systems have directed energy from the airborne vehicle in such forms as substantially coherent light and/or radiation to the aerosol particles and have received coherent light scattered from the aerosol particles. Such systems have then processed the received signals to obtain the desired data. Although such systems appear to be promising, they have not yet demonstrated the performance that may be realized by this invention and do not provide as accurate, sensitive and reliable information as may otherwise be desired.

In co-pending application Ser. No. 080,334, now U.S. Pat. No. 4,887,213 filed by Anthony E. Smart and Roger P. Woodward on July 31, 1987, for "Systems for, and Methods of, Providing for a Determination of the Movements of an Airborne Vehicle" and assigned of record to the assignee of record of this application, a system is disclosed and claimed for overcoming the above disadvantages. In one embodiment, light directed from a moving airborne vehicle and scattered from particles in the atmosphere produces, at first and second detectors at the vehicle, signals indicative of such scattered light. To reduce the effects of noise from stray light, the optical signals are spatially and spectrally filtered before detection. After optical detection, the electronic signals are further conditioned by amplification and special filtering.

The resultant signals are converted to digital signals. The digital signals are edited and accepted if they satisfy certain conditions pertaining to a selected threshold varied in accordance with the average amplitude level of the noise plus signal. The digital sampled signals from each particle are grouped. A centroid, based upon a weighting of the signals in each group in accordance with amplitude and time, is determined to represent the most probable time at which the particle crossed the peak of the illustrated region.

The peak amplitude of each signal from the first detector is paired with the peak amplitude of the successive signals from the second detector. The time difference between the paired signals, and their product amplitudes, are determined. The amplitude products are separated into successive bins on the basis of the time difference between the signals in each pair. The amplitude products in each bin are averaged. The bin with the greatest average amplitude product and the two (2) adjacent time bins are then selected.

The median time in the bin having the highest average product amplitude is used as a first approximation to the transit time of a particle between the two sheets. An estimate with enhanced accuracy may be obtained by calculating the "centroid", by a method analogous to that used above, of the distribution of events in the three (3) chosen bins. The bins may be of a width chosen to optimize the accuracy available from a small number of particle transits. Under certain circumstances, one event represented by the detection of the light reflected from a single particle is sufficient to obtain the required accuracy. The movement of the airborne vehicle may be determined from the selected time difference. Replication of the transit system to provide at least three pairs of illuminated regions may permit the direction to be obtained also.

This application discloses and claims improvements on the system disclosed and claimed in application Ser. No. 080,334. In one of these improvements, a plurality of lasers, each regulated to operate at a particular temperature, are supported by a manifold to direct coherent light into space. The regulation may be provided by producing pulses of a trickle current of a particular magnitude through the laser, measuring the voltage required to produce the trickle current and adjusting the characteristics of a thermoelectric member in accordance with the magnitude of such voltage to adjust the rate at which the thermoelectric member transfers heat from the laser.

The lasers produce substantially parallel and thin beams of light beams in pairs. The light beams in each pair provide an optimum angle for the interception by such paired beams of particles having individual trajectories in space. These particles scatter the light to a receiving lens system disposed within the manifold internally to the lasers. The received light then passes through masks which produce light beams in a spatial pattern corresponding to the pattern of the light beams from the lasers. The received light beams passing through the masks are detected to produce signals indicative of the light in such beams.

The manifold temperature may be regulated to maintain the optical characteristics of the lasers and the receiving system at an optimum value. The regulation may be provided by disposing heat sleeves on the manifold periphery, preferably in both axial and annular directions, and disposing in each heat sleeve a porous wick and a material convertible between liquid and gaseous forms. At positions above the regulated temperature, the liquid vaporizes and travels through the wick toward cooler spots where it vaporizes. It will be appreciated that the manifold temperature may be regulated by other means than that disclosed above.

The apparatus constituting this invention is adapted to be used in a system such as disclosed and claimed in application Ser. No. 080,334 filed by Anthony E. Smart and Roger P. Woodward on July 31, 1987, for "System For, and Methods of, Providing for a Determination of the Movement of an Airborne Vehicle in the Atmosphere". Co-pending application Ser. No. 080,334 is assigned of record to the assignee of record of this application. Co-pending application Ser. No. 080,334 discloses the system of this invention in considerable detail. This application discloses and claims certain improvements in the system of co-pending application Ser. No. 080,334.

Figure 1:
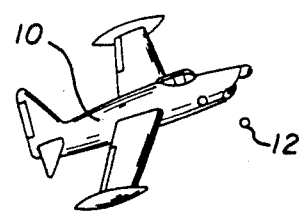
FIG. 1 is a schematic perspective view of an aircraft and of the disposition of the apparatus of the invention in the aircraft for directing light toward a particle in the atmosphere and for receiving fight reflected from the particle.

The apparatus constituting this invention may be disposed on an airborne vehicle 10 (FIG. 1) to direct substantially coherent light in thin beams toward particles, such as a particle 12, in space. The coherent light is scattered by the particles 12 back to the airborne vehicle 10. The scattered light is then processed at the airborne vehicle 10 to indicate the flight characteristics of the airborne vehicle with great accuracy.

Figure 2:
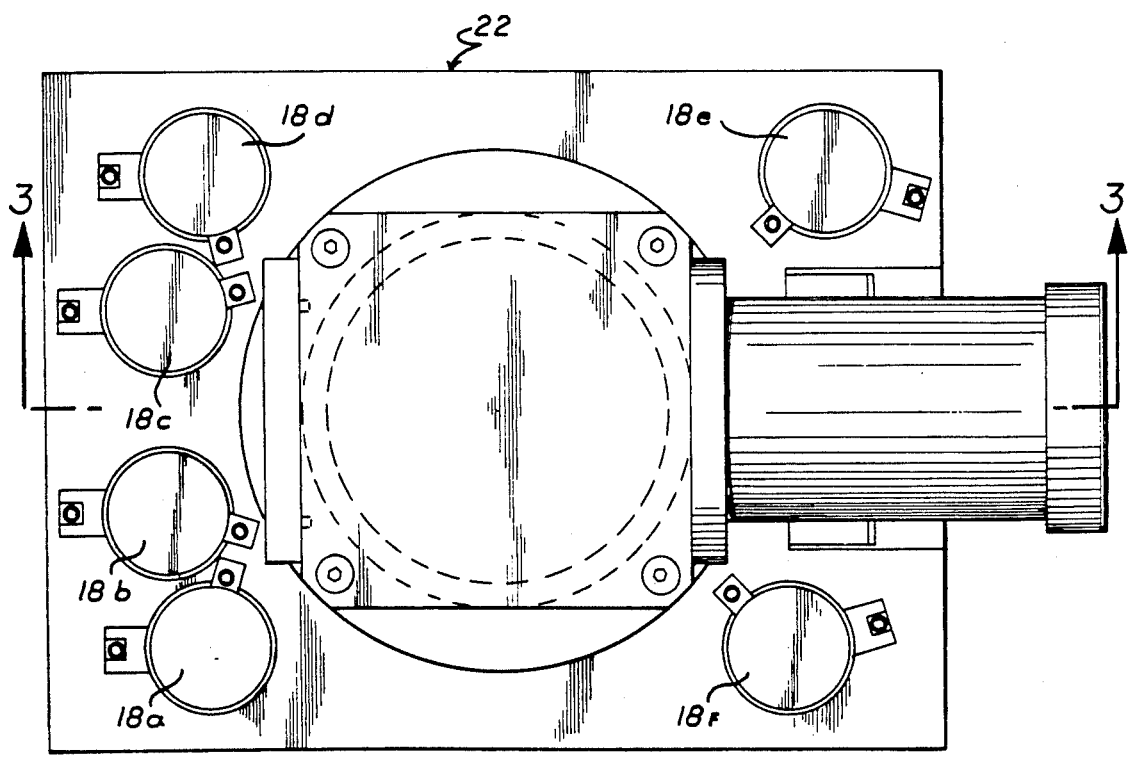
FIG. 2 is an elevational view of one embodiment of the apparatus constituting this invention.
Figure 3:
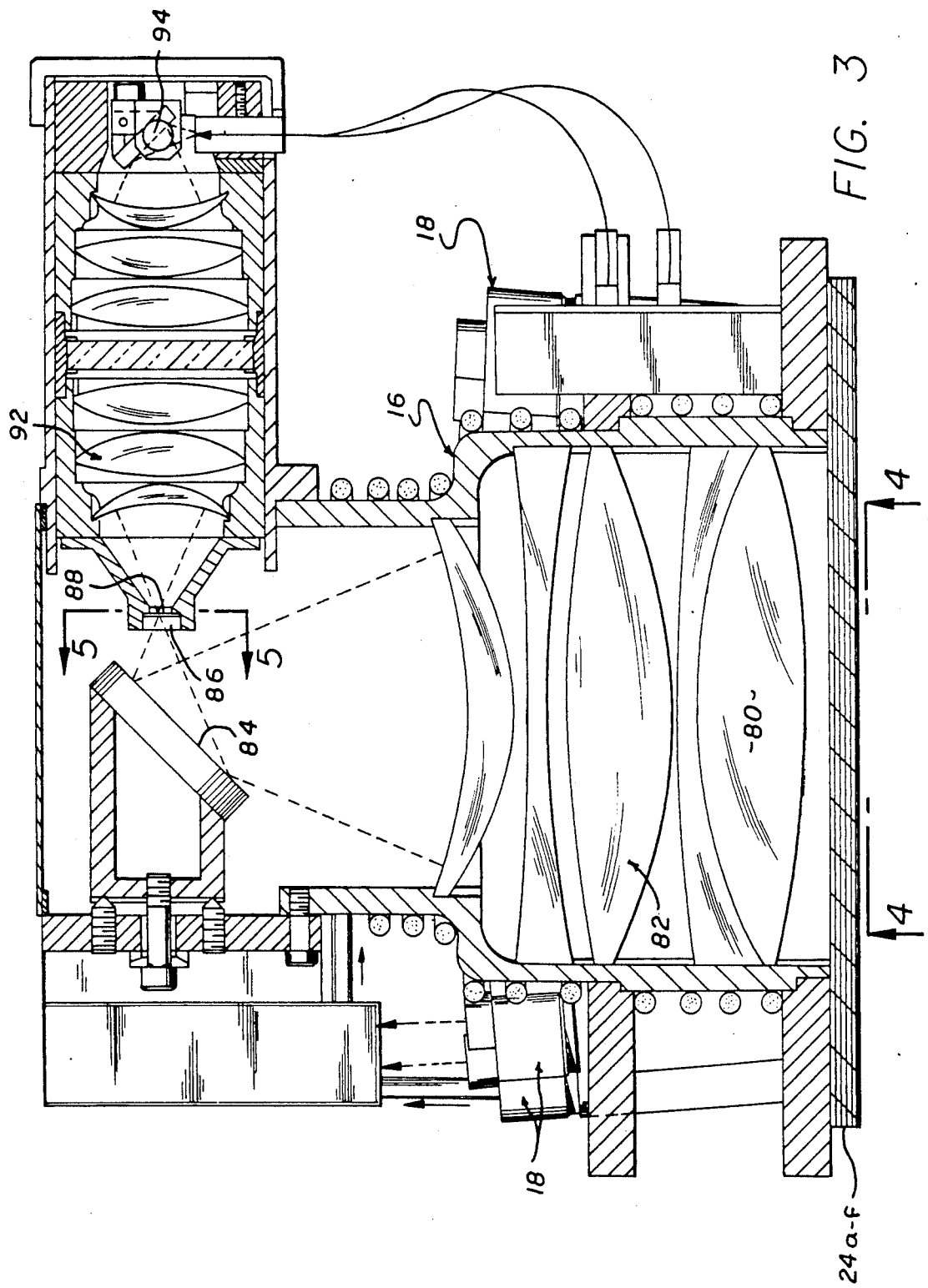
FIG. 3 is a sectional view of the apparatus shown in FIG. 2 and is taken substantially on the line 3—3 of FIG. 2.

In one embodiment of the invention, a manifold 16 (FIGS. 2 and 3) may be included in the apparatus constituting this invention and may be made from a suitable material such as a steel or a stainless steel or a composite material. A plurality of lasers generally indicated at 18 may be coupled to the manifold 16 around the external periphery of the manifold. The lasers 18 may be paired as at (a) 18a and 18 (b), 18c and 18d and (c) 18e and 18f. A manifold 20 (not shown) may be coupled to the manifold 16 and this manifold may be in turn coupled to a housing (not shown).

The lasers 18a–18f may be constructed in a conventional manner to produce substantially coherent light at a particular frequency and to direct such coherent light toward the particles 12 in space. As will ba seen, the lasers 18a–18f are disposed to direct the substantially coherent light on a slightly convergent basis. The lasers 18a and 18b produce thin beams of light having a spatial pattern respectively indicated at 26a and 26b in FIG. 4; the lasers 18c and 18d produce thin beams of light respectively indicated at 26c and 26d in FIG. 4; and the lasers 18e and 18f produce thin beams of light respectively indicated at 26e and 26f in FIG. 4.

Figure 4:
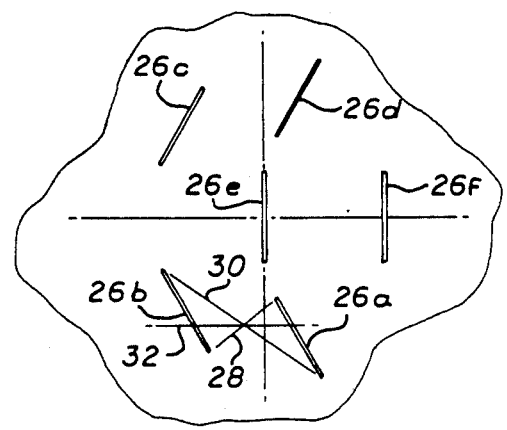
FIG. 4 is an enlarged schematic view of the relative disposition of different light beams produced by lasers in the apparatus shown in FIGS. 2 and 3.

The thin light beams 26a–26f may be disposed to travel into the plane of the paper in FIG. 4. As will be seen, the thin beams 26a and 26b, the thin beams 26c and 26d and the thin beams 26e and 26f are paired. The thin light beams in each pair are disposed relative to each other such that the particles 12 will have the widest trajectory angle in moving between the beams in such pair while intersecting the beams. This may be seen from a trajectory 28 between first diagonally opposite ends of the thin light beams 26a and 26b and a trajectory 30 at second diagonally opposite ends of such thin light beams.

As will be seen, in each of the trajectories 28 and 30 the particles 12 intersect the beams passing through the thin light beams 26a and 26b at the extremities of each beams. As a result, the trajectories 28 and 30 define the limits of the particle trajectories for intercepting the thin light beams 26a and 26b. The angles produced between a median trajectory 32 and each of the trajectories 28 and 30 are substantially equal.

The thin light beams 26a and 26b are displaced in a first direction (downwardly in FIG. 4) in the plane of the paper from the thin light beams slits 26c and 26d. Similarly, the thin light beams 26e and 26f are disposed between the thin light beams 26a and 26b and the thin light beams 26c and 26d. If the thin light beams 26e and 26f are considered to extend in a perpendicular direction in FIG. 4 in the plane of the paper, the thin light beams 26a and 26b and the thin light beams 26c and 26d form equal angles with the thin light beams 26e and 26f. However, the beams 26c and 26d slope in an opposite direction from the beams 26a and 26b. The beam 26d is displaced upwardly from the beam 26c to maximize the particle trajectories intersecting these beams as discussed in the previous paragraph. Similarly, the beam 26b is displaced downwardly from the beam.

Figure 5:
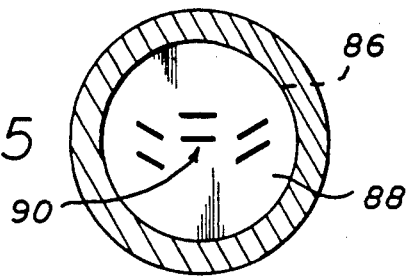
FIG. 5 is an enlarged schematic view of the disposition of masks, and slits in the masks, in the apparatus shown in FIGS. 2 and 3 for operating on the light reflected by particles in the atmosphere.
Figure 8:
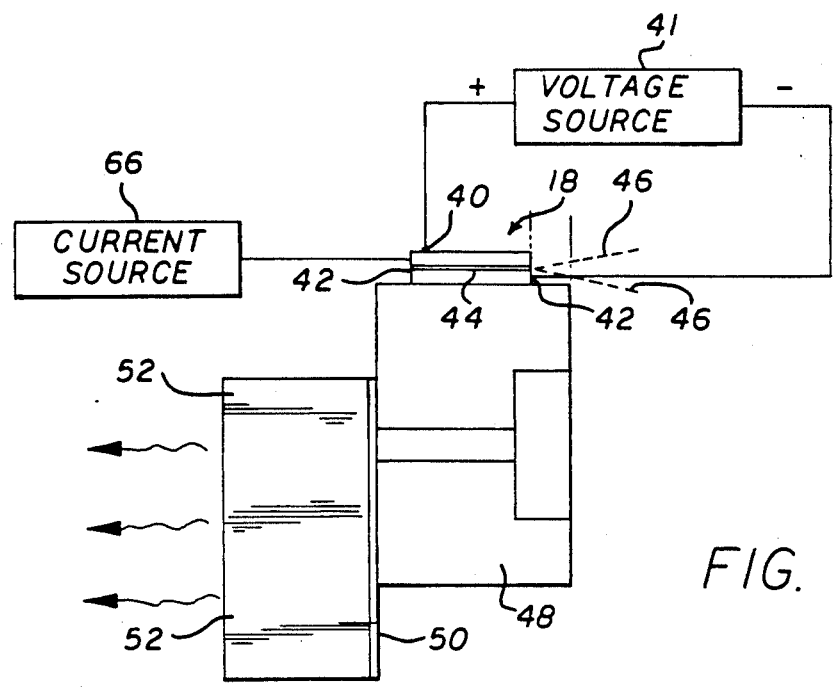
FIG. 8 is a schematic view of one of the lasers included in the apparatus shown in FIGS. 2 and 3 and of members associated with the laser for regulating the temperature of the laser.

Each of the lasers 18 may be provided with a pair of electrical terminals 40 and 42 (FIG. 8). The terminal 40 may be made from a suitable material such as gold and the terminal 42 may be made from a suitable material such as copper. A layer 44 may be disposed intermediate the terminals 40 and 44 and may be provided with a suitable thickness such as approximately two hundred microns (200 μm). The layer 44 may be made from a suitable material such as gallium arsenide. When a pulse of a positive voltage is applied to the terminal 40 from a variable voltage source 41 and a negative voltage is applied to the terminal 42 from the source, light having substantially coherent characteristics is emitted from the intermediate layer 44 at a particular frequency in a direction such as indicated at 46 in FIG. 5. It will be appreciated that this is a relatively simplified explanation since these features are well known in the art.

A heat sink 48 made from a suitable material such as copper is disposed in abutting relationship to the terminal 42 to transfer to the heat sink heat generated by the transmission of light by the intermediate layer 44. An electrical insulator 50 is disposed in abutting relationship with the heat sink 48 and a thermoelectric cooler 52 is in turn disposed in abutting relationship with the insulator 50. A suitable unit of the thermoelectric cooler 52 may be obtained from Marlow Inductries, Inc., of Dallas, Tex.

Figure 9:
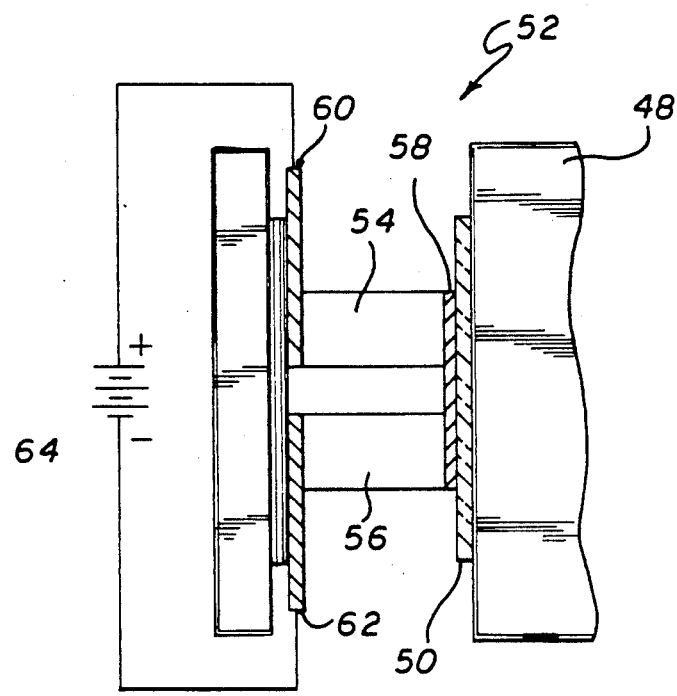
FIG. 9 is an enlarged fragmentary schematic view of certain of the members shown in FIG. 8.

The thermoelectric cooler 52 includes a pair of semiconductor members 54 and 56 (FIG. 9), the member 54 being an n-type semi-conductor and the member 56 being a p-type semi-conductor. The members 54 and 56 are connected by a bar 58 at the end adjacent to the insulator 50. Terminals 60 and 62 are respectively attached to the semi-conductor members 54 and 56 at the end opposite the insulator 50. A source 64 of electrical pulses is connected between the terminals 60 and 62. The source 64 is adapted to produce pulses having an adjustable rate and fixed duration under the control of the voltage from the source 64. Alternatively, the source 64 is adapted to produce pulses having a fixed rate and a variable duration under the control of the voltage from the source 64.

As previously described, each of the lasers 18 is constructed in a conventional manner to produce substantially coherent light at a particular frequency. This causes the laser 18 to generate heat. This heat is introduced to the heat sink 48 which dissipates some of the heat and introduces the remainder of the heat to the thermoelectric cooler, generally indicated at 52, for dissipation by the cooler.

The laser 18 is periodically turned off for a small period of time. When the laser 18 is turned off, a current source 66 (FIG. 8) is connected to the terminal 40 to produce a flow of a current of a low magnitude through the terminals 40 and 42 and the intermediate layer 44. For example, the current may have a suitable value such as approximately one milliampere (1 ma). The voltage required to produce this current varies in accordance with the temperature at the intermediate layer 44.

Figure 10:
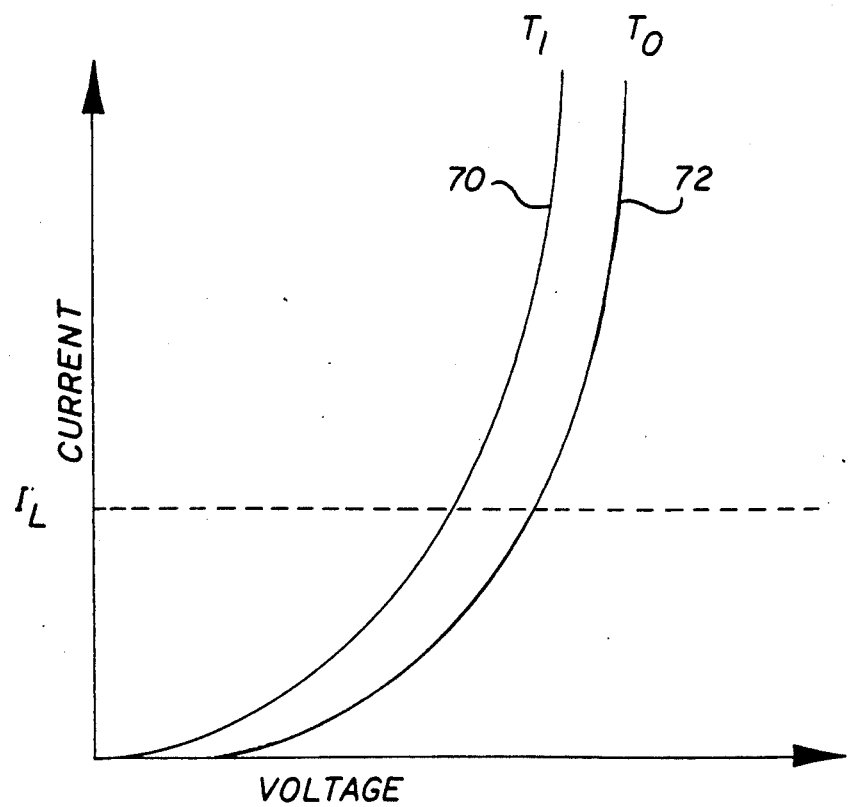
FIG. 10 is a graph schematically illustrating the regulating action of the temperature regulator shown in FIGS. 8 and 9.

The interrelationship between the temperature of the laser at the intermediate layer 44 and the voltage required to produce the current of the particular value such as approximately one milliampere (1 mA) is illustrated in FIG. 10. This current is illustrated at $I_L$ in FIG. 10. In FIG. 10, the current through the intermediate layer 44 is illustrated along the vertical axis and the voltage for producing this current is shown along the horizontal axis. In FIG. 10, the relationship between current and voltage for a temperature $T_1$ is illustrated at 70 and the relationship between current and voltage for a temperature $T_0$ is illustrated at 72 in FIG. 5.

For an "ideal" diode, the relationship between voltage, current and temperature is given by the equation $$I_L = I_0 e^{qV/kT} \quad (1)$$

In the above equation,
$I_0$ = a constant since it constitutes a predetermined current such as one milliampere (1 ma);
K = a constant;
q = a constant; and
$I_0$ = a constant for any given laser.
Equation (1) can be rewritten as $$V_D = \frac{kT}{q} \log I_L/I_0 \quad (2)$$

This can be further rewritten as $$T = \frac{V_D q}{K \log I_L/I_0}$$

As will be seen, the temperature of the laser is related to the voltage required to produce the current of one milliampere (1 mA) through the laser.

The measured temperature obtained from the voltage required to produce the pulse current of one milliampere (1 mA) is introduced to the source 64 to control the rate at which pulses are produced by the source. These pulses are introduced to the thermoelectric cooler 52 to obtain the flow of current through the semi-conductor members 54 and 56. This flow of current causes the junction of the thermoelectric cooler 52 adjacent the insulator 50 to have a higher temperature then the junction of the thermoelectric cooler adjacent to the terminals 60 and 62. Heat accordingly flows through the thermoelectric cooler 52 in a direction away from the heat sink 48.

As will be appreciated, the difference in temperature between the two junctions in the thermoelectric cooler 52 is dependent upon the rate at which the pulses are introduced by the source 64 to the thermoelectric cooler. For example, as the temperature at the intermediate layer 44 increases, the rate of introduction of pulses from the source 64 to the thermoelectric cooler 52 increases. This causes the thermoelectric cooler 52 to transfer an increased amount of heat from the heat sink 48. In this way, the controlled operation of the thermoelectric cooler 52 causes the temperature at the intermediate layer 44 of the laser 18 to be regulated.

The substantially coherent light from the lasers 18 is reflected by the particles 12 back to the manifold 16. The reflected light is received by a lens 80 (FIG. 3) within the manifold 16. The received light is collimated by lenses 82 and is partially focused on a mirror 84. The light is then reflected by the mirror 84 to a lens 86. A mask 88 is disposed on the surface of the lens and is provided with a plurality of slits 90 (FIG. 5) in a pattern corresponding to the pattern of the light beams from the lasers 18. This pattern is shown in FIG. 4 and has been described fully above. The light is then collimated and focused as by lenses 92 (FIG. 3) on a detector 94. The detector 94 produces signals in accordance with the light pulses passing through the slits 90. The signals are then processed in a manner such as disclosed in detail in co-pending application Ser. No. 080,334.

The temperature of the manifold 16 may be regulated to control the optical characteristics of the light transmitted by the lasers 18 and the optical characteristics of the receiving lenses including the lens 80, the lenses 82, the mirror 84, the lens 86 and the lenses 92. In this way, the apparatus constituting this invention can provide accurate determinations of the function of the movement and attitude of the airborne vehicle in the atmosphere.

Figure 7:
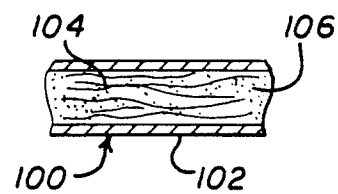
FIG. 7 is an enlarged fragmentary sectional view of one of the heat pipes shown in FIG. 6.
Figure 6:
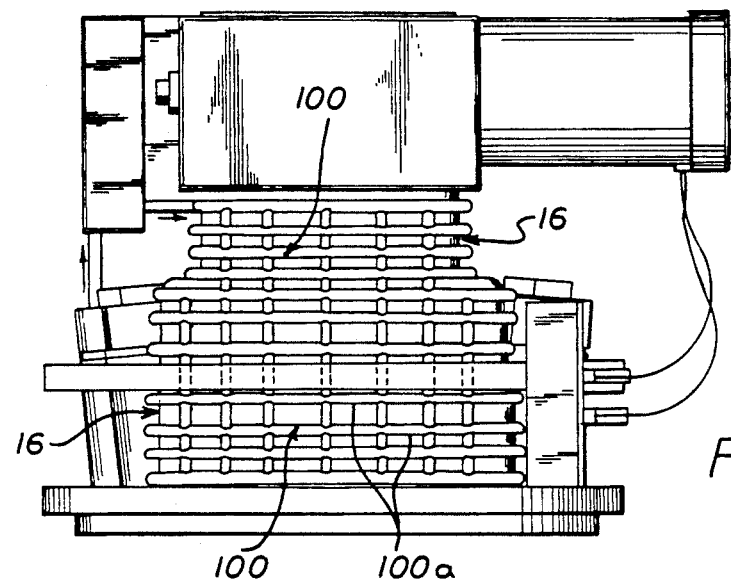
FIG. 6 is a schematic view of heat pipes associated with the apparatus shown in FIG. 2 and 3 for regulating the temperature of the apparatus shown in FIGS. 2 and 3.

To regulate the temperature of the manifold 16, heat pipes generally indicated at 100 (FIGS. 6 and 7) may be disposed around the periphery of the manifold. Some of the heat pipes 100 may be disposed in an annular direction as indicated at 100a in FIG. 6 and other heat pipes may be disposed in an axial direction. It will be appreciated that still other heat pipes may be disposed in a direction having both annular and axial components.

Each of the heat pipes 100 includes a hollow sleeve 102 (FIG. 7) made from a suitable material such as steel or stainless steel. A wick 104 made from a suitable porous material such as steel is disposed within the sleeve 102 adjacent the inner periphery of the sleeve. A material 106 such as methylene chloride or sodium is disposed within the sleeve 102. The material 106 such as methylene chloride or sodium is convertible between the liquid and gaseous states at a temperature relatively close to the temperature at which the manifold 16 is to be regulated.

When the temperature of the manifold 16 increases above the regulated value at a particular position, the material 106 at this position vaporizes. In vaporizing, the material 106 absorbs heat. The vaporized material 106 then travels through the wick 104 to a position at which the temperature is less than the regulated value. At this position, the material condenses to a liquid and gives up heat. This causes the temperature at this position to rise toward the regulated value. In this way, the temperature of the manifold 16 at the different positions is regulated at a particular value.

The apparatus constituting this invention has certain important advantages. It provides a manifold which supports both the light-transmitting and light-receiving components and it regulates the temperature of the manifold to maintain the optical characteristics of the light transmissions and the light receptions at an optimum value. The apparatus of this invention also provides for the transmission and reception of beams of light having an optimum disposition relative to one another to provide for the interception of particles through optimum angles of movement relative to such beams.

The apparatus of this invention also provides for a precise regulation of the temperatures of the lasers to maintain the optical characteristics of the lasers within precise limits. It will be appreciated that the system for regulating the temperatures of the lasers may be used in other environments than in a system for determining a function of the movement and attitude of the airborne vehicle 10 in the atmosphere.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. In combination for use in an airborne vehicle, a manifold,
a plurality of lasers supported by the manifold in a relationship for directing beams of light into space for reflection by the particles in space,
a lens system supported by the manifold for receiving light reflected from the particles in space and for converting the light into beams and for collimating and focussing the beams,
detector means responsive to the focused beams for producing signals in accordance with the characteristics of such beams, and
means associated with the manifold for regulating the temperature of the manifold at a substantially constant value, the regulating means including means for converting a fluid between a liquid state and a gaseous state in accordance with the temperature at different positions on the manifold.

2. In a combination as set forth in claim 1,
means associated with the lasers for regulating the temperatures of the lasers.

3. In a combination as set forth in claim 1,
the means for regulating the manifold at the substantially constant temperature including means for regulating the temperature at different positions on the manifold in accordance with the temperature of the manifold at such positions.

4. In combination for use in an airborne vehicle,
a manifold,
a plurality of lasers supported by the manifold in a relationship for directing beams of light into space for reflection by the particles in space,
a lens system supported by the manifold for receiving light reflected from the particles in space and for converting the light into beams and for collimating and focusing the beams,
detector means responsive to the focused beams for producing signals in accordance with the characteristics of such beams, and
means associated with the manifold for regulating the temperature of the manifold at a substantially constant value,
the regulating means including hollow sleeves disposed on the manifold in transverse directions and including porous wicks in the sleeves and a material having liquid and gaseous stages and convertible between the liquid and gaseous stages and movable through and along the wicks in accordance with differences in the manifold temperature at individual positions on the manifold.

5. In combination for use in an airborne vehicle,
a manifold,
a plurality of lasers supported in pairs by the manifold to direct light into space in thin beams transverse to the airborne vehicle,
means supported by the manifold for receiving light reflected from the particles and for collimating the light and for converting the collimated light into beams corresponding to the beams directed from the lasers and for focussing such light beams.
means disposed within the manifold relative to the receiving means for detecting the focussed beams, and
means associated with the manifold for regulating the configuration and dimensions of the manifold within particular limits to regulate the characteristics of the light beams directed from the laser relative to the characteristics of the light beams passing through the receiving means, the regulating means including means disposed relative to the manifold for providing a fluid and for providing for a displacement of the fluid between different positions along the manifold for the conversion of the fluid between liquid and gaseous states during such displacement in accordance with the temperature of the manifold at such positions.

6. In a combination as set forth in claim 5, the regulating means being constructed to maintain the temperature of the manifold substantially constant at different positions in the manifold.

7. In a combination as set forth in claim 5, the regulating means including means disposed on the manifold and constructed to provide for the dispersion of heat from positions on the manifold at temperatures above a particular value to positions on the manifold at temperatures below such particular value to regulate the temperature of the manifold at the different positions on the manifold.

8. In a combination as set forth in claim 5, means for regulating the temperature of the lasers.

9. In combination for use in an airborne vehicle, a manifold, first means supported by the manifold for producing substantially coherent light in particular patterns in space, second means supported by the manifold for receiving light reflected from the particles in space and for producing, from such reflected light, patterns of light corresponding to the patterns of light produced by the first means, third means disposed within the manifold for passing the light from the second means only within particular frequency limits, fourth means disposed within the manifold for detecting the light passed by the third means, and means for regulating the temperature of the manifold at different positions on the manifold, the regulating means including means disposed relative to the manifold for converting a fluid in the manifold between liquid and gaseous states at different positions in the manifold in accordance with the temperature at such different positions in the manifold.

10. A combination as set forth in claim 9, including, the first means including a plurality of paired means, each pair being disposed to produce a beam of light in an optimum angle of particle trajectories and being disposed relative to the other pairs of such means to produce the light at a different angle than the light produced by the other pairs of such means.

11. In combination for use in an airborne vehicle, first means supported by the manifold for producing substantially coherent light in particular patterns in space, second means supported by the manifold for receiving light reflected from the particles in space and for producing, from such reflected light, patterns of light corresponding to the patterns of light produced by the first means, third means disposed within the manifold for passing the light form the second means only within particular frequency limits, fourth means disposed within the manifold for detecting the light passed by the third means, and means for regulating the temperature of the manifold at the different positions on the manifold to maintain the optical characteristics of the first and second means within particular limits the first means including a plurality of paired means, each pair being disposed to produce a beam of light in an optimum angle of particle trajectories and being disposed relative to the other pairs of such means to produce the light at a different angle than the light produced by the other pairs of such means, the regulating means including a plurality of heat pipes each disposed on the manifold and each including a sleeve and a porous wick disposed in the sleeve and a material having liquid and porous states and having properties of passing through the porous wick in the gaseous state to transfer heat from positions on the manifold with temperatures above the regulated temperature positions on the manifold with temperatures below such regulated temperature.

12. In a combination as set forth in claim 11, including, the plurality of first means including lasers, and means for regulating the temperature of the lasers.

13. A combination as set forth in claim 12, including, the temperature-regulating means for each laser including means for passing a pulse of a limited current through the laser and for determining the voltage required to produce such current, thermoelectric means for transferring heat from the laser, and means for regulating the operation of the thermoelectric means in accordance with the magnitude of the voltage produced during such current pulse.

14. In combination, a laser constructed to transmit coherent light on a pulsing basis, thermoelectric means associated with the laser for passing heat from the laser, means for introducing pulses of energy to the thermoelectric means to generate a thermoelectric action in the thermoelectric means for obtaining the transfer of heat by the thermoelectric means from the laser, means for introducing a current of a limited amplitude to the laser during the periods between the pulsed transmission of coherent light by the laser to obtain the production of a voltage in accordance with the temperature in the laser, and means responsive to the voltage produced by the current of limited amplitude through the laser for regulating the energy pulses introduced to the thermoelectric means to control the temperature of the laser.

15. In combination, a laser constructed to transmit coherent light, thermoelectric means associated with the laser for passing heat from the laser, means for introducing pulses of energy to the thermoelectric means to generate a thermoelectric action in the thermoelectric means for obtaining the transfer of heat by the thermoelectric means from the laser, means for introducing a current of a limited amplitude to the laser and for determining the voltage produced by the current of the limited amplitude through the laser, and means responsive to the voltage produced by the current of limited amplitude through the laser for regulating the characteristics of the energy pulses introduced to the thermoelectric means to control the temperature of the laser, the laser including a plurality of layers disposed in a stacked relationship, an intermediate one of the layers being constructed to emit light, means for introducing a voltage between the layers on opposite sides of the intermediate layers to produce a current at the intermediate layer for obtaining the emission of light, and the determined voltage being that introduced to the layers on the opposite sides of the intermediate layer to produce the current of the limited amplitude through the intermediate layer.

16. In combination, a laser constructed to transmit coherent light, thermoelectric means associated with the laser for passing heat from the laser, means for introducing pulses of energy to the thermoelectric means to generate a thermoelectric action in the thermoelectric means for obtaining the transfer of heat by the thermoelectric means from the laser, means for introducing a current of a limited amplitude to the laser and for determining the voltage produced by the current of the limited amplitude through the laser, and means responsive to the voltage produced by the current of limited amplitude through the laser for regulating the characteristics of the energy pulses introduced to the thermoelectric means to control the temperature of the laser.

a heat sink disposed between the layer and the thermoelectric means to receive the heat generated by the laser and to pass such heat to the thermoelectric means, and the thermoelectric means including a pair of semiconductor elements connected in the thermoelectric means for producing currents through the semiconductor elements to draw heat from the heat sink through the thermoelectric means to regulate the temperature of the laser.

17. In combination, a laser constructed to transmit coherent light, thermoelectric means associated with the laser for passing heat from the laser, means for introducing pulses of energy to the thermoelectric means to generate a thermoelectric action in the thermoelectric means for obtaining the transfer of heat by the thermoelectric means from the laser, means for introducing a current of a limited amplitude to the laser and for determining the voltage produced by the current of the limited amplitude through the laser, and means responsive to the voltage produced by the current of limited amplitude through the laser for regulating the charactersitics of the energy pulses introduced to the thermoelectric means to control the temperature of the laser, the regulating means being operative to regulate the rate of the pulses through the thermoelectric means in accordance with the voltage determined to produce the current of limited amplitude through the laser.

18. In a combination as set forth in claim 14, the regulating means being operative to regulate the rate of the pulses through the thermoelectric means in accordance with the voltage produced by the current of limited amplitude through the laser.

19. In combination, a laser constructed to emit substantially coherent light, means for periodically energizing the laser to obtain the emission of the substantially coherent light from the laser, means for applying to the laser, at times between the periodic energizing of the laser, a voltage variable to produce a current of a particular low amplitude through the laser, means for withdrawing heat from the laser, and means responsive to the variable voltage for controlling the rate of withdrawal of heat from the laser by the withdrawing means to regulate the temperature of the laser.

20. In a combination as set forth in claim 19, the controlling means including thermoelectric means having a pair of displaced junctions and responsive to the variable voltage for producing differences in the temperatures at such junctions to control the transfer of heat from the laser.

21. In a combination as set forth in claim 20, a heat sink associated with the laser for transferrring heat from the laser, and the thermoelectric means being associated with the heat sink for transferring heat from the heat sink to the thermoelectric means on a controlled basis to regulate the temperature of the laser.

22. In a combination as set forth in claim 21, the thermoelectric means including at least a pair of semi-conductors connected to each other in a particular relationship to define the junctions.

23. In a combination as set forth in claim 22, the laser including a pair of terminals and a thin layer disposed between the terminals and made from a material to generate light when voltage pulses are applied between the pair of terminals to generate a large current through the thin layer.

24. In combination, a laser constructed to transmit coherent light, the laser including first and second spaced terminals, and a junction layer disposed between the first and second spaced terminals, heat transfer means disposed relative to the second terminal and operative to transfer heat from the laser and constructed to transfer a variable amount of heat in accordance with the temperature of the laser , and means associated with the laser for determining the temperature of the laser at the junction layer and for controlling the operation of the heat transfer means in accordance with such temperature determination to regulate the temperature of the laser.

25. In a combination as set forth in claim 24, wherein the means for determining the temperature of the laser at the junction layer includes means for determining the voltage required to produce a current of a particular magnitude through the laser.

26. In a combination as set forth in claim 25 wherein the heat transfer means is responsive to the voltage produced by the current of the particular magnitude for regulating the amount of heat transferred by the heat transfer means from the laser.

27. In a combination as set forth in claim 26, wherein the heat transfer means includes a thermoelectric cooler means and wherein means are included for pulsing the thermoelectric cooler means at a variable rate to transfer variable amounts of heat from the thermoelectric cooler means in accordance with such variable rate and wherein means are responsive to the voltage produced by the current of the particular magnitude for varying the rate at which the pulsing means operates to transfer heat from the thermoelectric cooler.

28. In combination, a laser constructed to transmit coherent light, the laser including a pair of electrical terminals spaced from each other, the laser further including a layer of a material disposed between the electrical terminals with properties of emitting light when a voltage is applied between the pair of electrical terminals, first means for applying pulses of voltage between the electrical terminals to obtain an emission of light, second means operative in the time between the pulses of voltage producing a current of a particular magnitude between the electrical terminals to obtain a voltage dependent upon the temperature of the layer of material disposed between the electrical terminals, third means disposed relative to the laser for conducting heat from the laser, and fourth means responsive to the voltage from the second means for varying the rate at which heat is conducted by the third means from the laser.

29. In a combination as set forth in claim 32, the third means including heat sink means pulsed at a variable rate to conduct heat from the laser in accordance with such pulsing, the fourth means including means responsive to the voltage from the second means for varying the rate at which the third means pulsed in accordance with variations in the voltage to regulate the temperature of the laser at particular value.

30. In a combination as set forth in claim 29, the second means being operative to produce the current on a pulsed basis between the times when the pulses of voltage are applied between the electrical terminals of the laser.

31. In a combination as set forth in claim 29, the layer being made from gallium arsenide, one of the terminals being made from gold and the other terminal being made from copper, the second means being operative to produce the current on a pulsed basis between the times when the pulses of voltage are applied between the electrical terminals of the laser.

32. In a combination as set forth in claim 28, the layer being made from gallium arsenide.

* * * * *